United States Patent

[11] 3,603,813

[72] Inventor James N. Hall
Palo Alto, Calif.
[21] Appl. No. 881,811
[22] Filed Dec. 3, 1969
[45] Patented Sept. 7, 1971
[73] Assignee The United States of America as represented by the United States Atomic Energy Commission

[54] FIELD EFFECT TRANSISTOR AS A BUFFER FOR A SMALL SIGNAL CIRCUIT
2 Claims, 2 Drawing Figs.

[52] U.S. Cl. 307/237, 307/202, 307/264, 307/297, 307/304, 328/54, 328/169
[51] Int. Cl. H03k 5/08
[50] Field of Search 307/237, 202, 264, 297, 268, 304, 235; 328/169, 54

[56] References Cited

UNITED STATES PATENTS

| | | | |
|---|---|---|---|
| 3,023,326 | 2/1962 | Cone | 307/237 X |
| 3,369,129 | 2/1968 | Wolterman | 307/237 |
| 3,408,511 | 10/1968 | Bergersen et al. | 307/237 |
| 3,444,397 | 5/1969 | Lym | 307/237 X |
| 3,489,919 | 1/1970 | Wolterman | 307/235 X |
| 3,502,903 | 3/1970 | Wade | 307/237 X |
| 3,521,087 | 7/1970 | Lombardi | 307/237 |
| 3,524,074 | 8/1970 | Pratt, Jr. | 307/304 X |

*Primary Examiner*—Stanley T. Krawczewicz
*Attorney*—Roland A. Anderson

ABSTRACT: A field effect transistor having its drain and gate electrodes connected across a large signal generator and its source and gate electrodes connected across the input of a small signal circuit for protecting the circuit from high level signal variations at the generator.

INVENTOR.
JAMES N. HALL
BY
Attorney

FIELD EFFECT TRANSISTOR AS A BUFFER FOR A SMALL SIGNAL CIRCUIT

BACKGROUND OF THE INVENTION

The invention disclosed herein was made under, or in, the course of Contract AT(04–3)–400 with the United States Atomic Energy Commission.

The present invention relates to a buffer for a small signal circuit, and more particularly it relates to a field effect transistor (FET) as such a buffer.

Frequently it is found desirable to couple large signal circuits to small signal microcircuits which can withstand only limited voltage swings, typically in the range of 1 to 5 volts. The microcircuits therefore must be protected from the voltage swings of high level input signals and high level noise. Standard protection for a small signal circuit from large voltage variations applied to its input is by means of a diode gate at the input of the circuit. Such gates however, are relatively expensive, they require large biasing and driving currents, they have been found to be unreliable, and they are bulky in contrast to the microcircuits that they protect. Diode gates therefore, are particularly disadvantageous where a large number of microcircuits are to be used, such as in a digital system where a large number of remotely transmitted high level signals are to be processed in microcircuits prior to their application to a computer.

SUMMARY OF THE INVENTION

The invention pertains to a field effect transistor (FET) as a buffer for a small signal circuit. Such an arrangement has a number of advantages over known buffer circuits: an FET can withstand large voltage variations, in the range of +40 volts to −40 volts, and still produce a low level signal output, thereby giving an FET buffer a very wide dynamic range; an FET is susceptible of being made of a size comparable to a microcircuit logic element and therefore can be readily combined with the element to form an integrated circuit; an FET is more reliable as a buffer since only one component is required in contrast to the several components of the prior art, and the single component also results in a lower cost; and an FET buffer circuit may be made normally nonconducting, resulting therefore in no quiescent current drain and in very low power requirements even for a very large number of circuits.

It is an object of the invention to minimize the power requirements, size and cost of a buffer to a small signal circuit and to maximize the dynamic range and reliability of the buffer.

Another object is to buffer the input of a small signal circuit with a field effect transistor.

Other objects and advantageous features of the invention will be apparent in a description of a specific embodiment thereof, given by way of example only, to enable one skilled in the art to readily practice the invention, and described hereinafter with reference to the accompanying drawing.

DESCRIPTION OF AN EMBODIMENT

Figure 1:
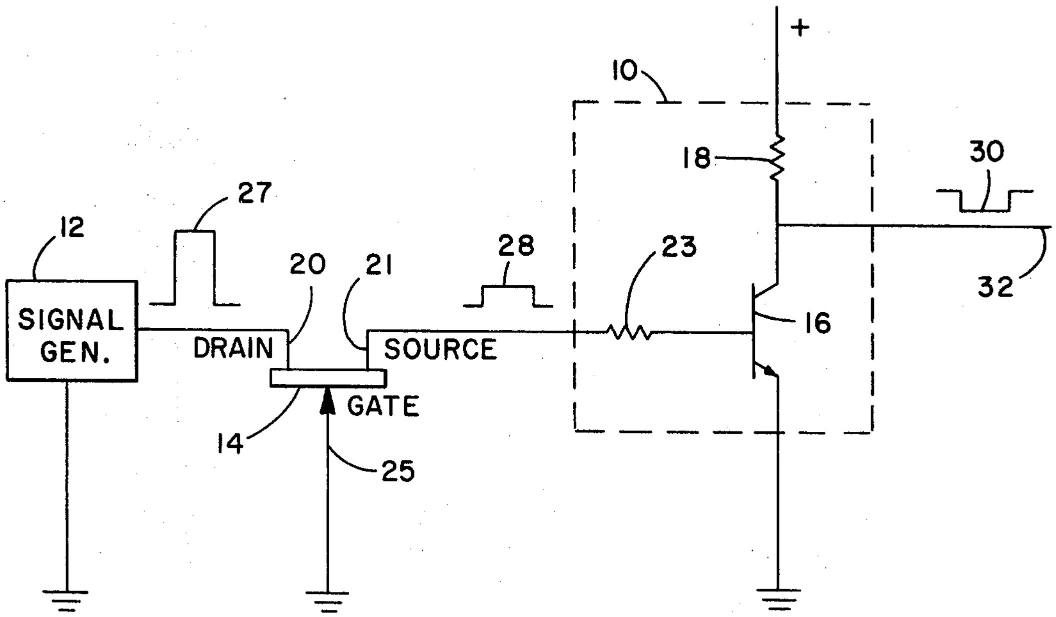
FIG. 1 is a schematic diagram of a small signal circuit that is buffered with a field effect transistor according to the invention.

Referring to the drawing there is shown in FIG. 1 a small signal circuit 10 connected to a large signal generator 12 through a field effect transistor (FET) 14 as a buffer which protects the circuit 10 from high level voltage variations from the generator. The specific circuitry for the circuit 10 is shown in FIG. 1 as an example only of a small signal circuit with which a field effect transistor may be used. The circuit 10 is an inverter and is comprised of an NPN transistor 16 having its emitter connected to ground and its collector connected through a resistor 18 to the positive pole of a power source. The FET 14 is comprised of a drain electrode 20 connected to the output of the large signal generator 12, a source electrode 21 connected to the base of the transistor 16 through a current limiting resistor 23 and a gate electrode 25 connected to ground. The resistor 23 is often included in commercially available integrated circuits but it is not required for operation of FET 14 as a buffer.

Figure 2:
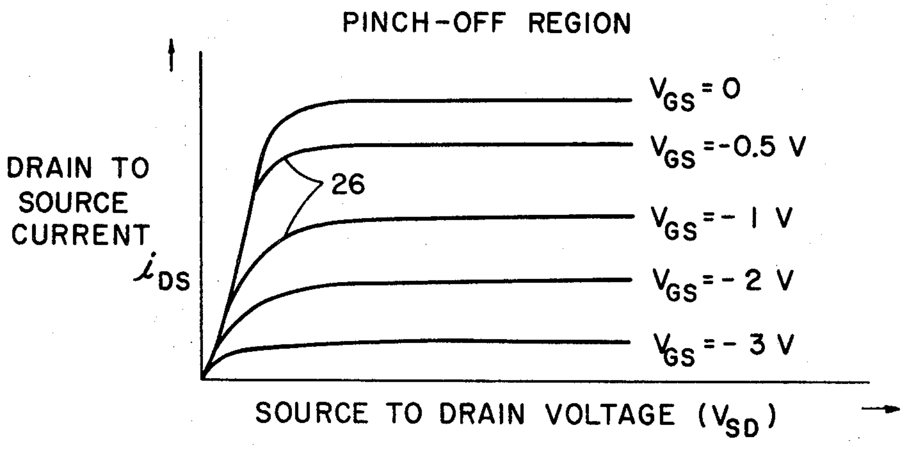
FIG. 2 is a family of typical characteristic curves for an N-channel field effect transistor.

It may be seen by reference to FIG. 2 that the drain to source current $i_{DS}$ is a function of the gate to source voltage $V_{GS}$ regardless of the rise of source to drain voltage $V_{SD}$ above a pinch-off region. The pinch-off region corresponds to knees 26 of the curves in FIG. 2, and any rise of source to drain voltage beyond the pinch-off region results in a drain to source current that is limited by the gate to source bias voltage. This bias voltage is developed when transistor 16 is conducting current and saturated. For example, the base-emitter voltage of transistor 16 is typically 0.7 volts. A voltage is developed thereby across resistor 23 and the gate to source of FET 14 that is proportional to the current flowing from the drain to the source of the FET 14. This current will be constant however since the operating point of the FET 14 will be established on one of the $V_{GS}$ curves in FIG. 2 above the pinch-off region. Thus, the drain to source current may be used to develop low level output signals in response to a large dynamic range of source to drain voltages which may range from zero to the breakdown voltage of the FET without a significant increase in the drain to source current.

In operation a high level signal 27 applied from the signal generator 12 across the drain and gate electrodes of the FET 14 drives the FET to conduct according to a characteristic curve determined by the gate to source voltage ($V_{GS}$). This voltage is established by the value of the resistor 23 and the base-emitter voltage of transistor 16. The drain to source current is rapidly brought to a constant level that is independent of any further increase in source to drain voltage ($V_{SD}$), thereby resulting in a predetermined maximum low level signal 28 being developed in the output circuit of the FET and applied across the base-emitter junction of the transistor 16. The transistor 16 is forward biased thereby, causing the transistor 16 to conduct and develop an inverted output pulse 30 at its collector for application to an output terminal 32. Similarly any high level noise applied from the generator 12 to the FET 14 is limited to harmless low level signals that will not damage the circuit 10. Such noise signals, although passed by the circuit 10 to its output will be rejected because of their narrow width by other circuits (not shown) of the system.

In a model exemplifying the invention an FET was integrated with a microcircuit inverter 10 comprised of a transistor 16, a 640 ohm resistor 18 and a 450 ohm resistor 23. Signals ranging from +0.7 volt to +40 volts were applied across the drain and gate electrodes of the FET which resulted in pulses across the source and gate electrodes with peaks of 2 volts and negative pulses at the output of the circuit 10 with peaks of 3.6 volts. Simulated noise ranging from −40 volts to +40 volts was also applied across the drain and gate electrodes of the FET without producing voltages damaging to the circuit 10.

While an embodiment of the invention has been shown and described, further embodiments or combinations of those described herein will be apparent to those skilled in the art without departing from the spirit of the invention

What I claim is:

1 A transistorized microcircuit inverter logic element and a protective circuit in combination, comprising:

- a signal generator for producing signals that range to high levels;
- a single field effect transistor having an input circuit and an output circuit, said field effect transistor including a drain, a gate and a source, said input circuit including said drain and said gate, and said output circuit including said source and said gate;

means connecting said input circuit to said generator, said field effect transistor being responsive to signals from said signal generator for producing in said output circuit corresponding low level signals that cannot rise above a predetermined level that is low with respect to the level of the high ranging signals from said generator;

a transistorized microcircuit inverter logic element including a transistor having an emitter, collector, and base, and a first resistor in series with said collector, and an output connection between said collector and resistor; and a second resistor connected between said source and said base for attenuating the low level signals in said output circuit of said field effect transistor, said microcircuit transistor being responsive to the attenuated signals applied to said base to produce at said output connection signals that are at a low level with respect to the high ranging signals from said generator.

2. The logic element and protective circuit of claim 1, wherein said field effect transistor is of the N-channel-type said microcircuit transistor is an NPN transistor, said signal generator produces positive going signals, said corresponding low level signals in said output circuit are positive going, and said signals produced at the output connection of said microcircuit are negative going.